(12) United States Patent
Coffy

(10) Patent No.: US 8,232,113 B2
(45) Date of Patent: Jul. 31, 2012

(54) METHOD FOR MANUFACTURING AND TESTING AN INTEGRATED ELECTRONIC CIRCUIT

(75) Inventor: Romain Coffy, Saint Martin le Vinoux (FR)

(73) Assignee: STMicroelectronics (Grenoble) SAS, Grenoble (FR)

( * ) Notice: Subject to any disclaimer, the term of this patent is extended or adjusted under 35 U.S.C. 154(b) by 0 days.

(21) Appl. No.: 12/990,684

(22) PCT Filed: May 20, 2009

(86) PCT No.: PCT/EP2009/056183
§ 371 (c)(1),
(2), (4) Date: Dec. 7, 2010

(87) PCT Pub. No.: WO2009/141402
PCT Pub. Date: Nov. 26, 2009

(65) Prior Publication Data
US 2011/0092000 A1  Apr. 21, 2011

(30) Foreign Application Priority Data
May 22, 2008  (FR) ...................... 08 53337

(51) Int. Cl.
*G01R 31/26* (2006.01)
(52) U.S. Cl. ............ 438/14; 438/15; 257/E21.521
(58) Field of Classification Search ............ 438/14, 438/15, 612, 613; 257/E21.521
See application file for complete search history.

(56) References Cited

U.S. PATENT DOCUMENTS

| 2001/0010404 A1 | 8/2001 | Ker et al. |
| 2003/0027379 A1* | 2/2003 | Liu .............................. 438/132 |
| 2004/0041393 A1 | 3/2004 | Lee |
| 2004/0070079 A1 | 4/2004 | Huang et al. |
| 2006/0049511 A1 | 3/2006 | Schaefer |
| 2006/0231951 A1* | 10/2006 | Jan et al. ....................... 257/737 |

FOREIGN PATENT DOCUMENTS

| JP | 02241046 A | 9/1990 |
| JP | 2000232127 A | 8/2000 |
| JP | 2003249534 A | 9/2003 |
| JP | 2005317867 A | 11/2005 |
| WO | WO 2004075265 A2 | 9/2004 |
| WO | WO 2009141402 A1 | 11/2009 |

OTHER PUBLICATIONS

International Search Report dated Sep. 29, 2009 from corresponding International Application No. PCT/EP2009/056183, (Sep. 29, 2009).

* cited by examiner

*Primary Examiner* — Khiem D Nguyen
(74) *Attorney, Agent, or Firm* — Wolf, Greenfield & Sacks, P.C.

(57) ABSTRACT

A method for manufacturing and for testing an integrated circuit, including the steps of forming, on the upper portion of the integrated circuit, a passivation layer including openings at the level of metal tracks of the last interconnect stack of the integrated circuit; forming, in the openings, first pads connected to second pads formed on the passivation layer by conductive track sections, the first pads being intended for the connection of the integrated circuit; testing the integrated circuit by bringing test tips in contact with the second pads; and eliminating at least a portion of at least one of the conductive track sections.

19 Claims, 3 Drawing Sheets

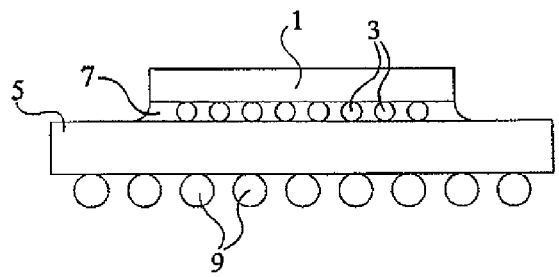
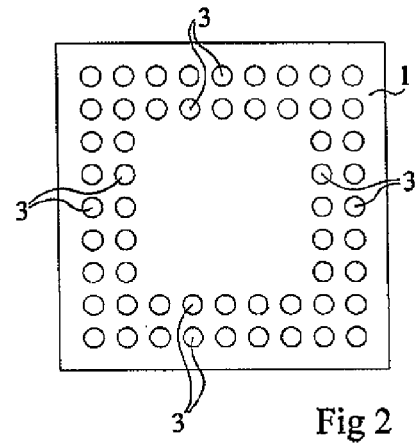
Fig 1                Fig 2
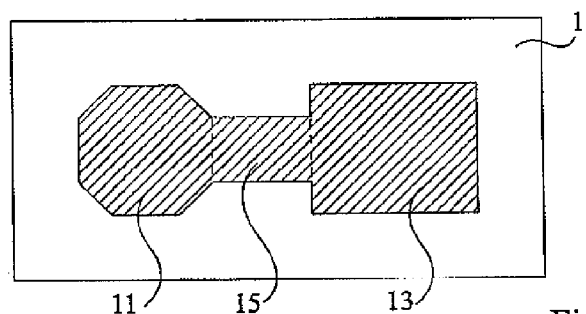
Fig 3
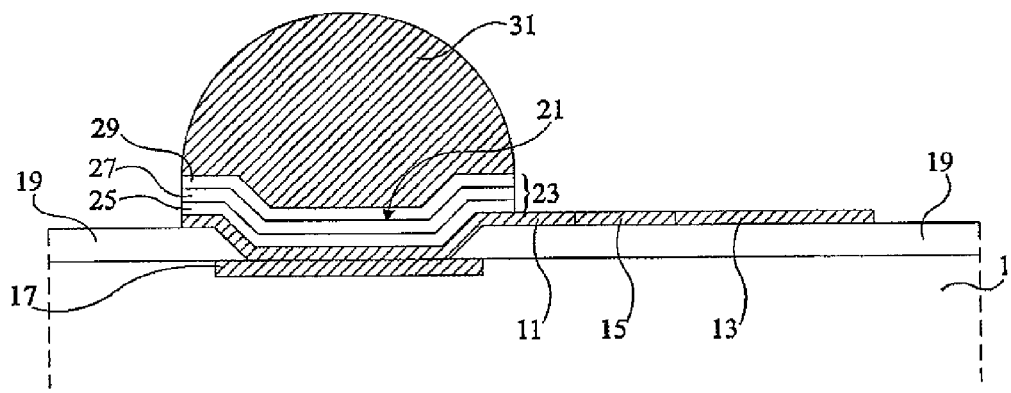
Fig 4

METHOD FOR MANUFACTURING AND TESTING AN INTEGRATED ELECTRONIC CIRCUIT

CROSS REFERENCE TO RELATED APPLICATIONS

This application is a U.S. National Stage patent application based on PCT application number PCT/EP2009/056183, filed on May 20, 2009, entitled "Method For Manufacturing And Testing An Integrated Electronic Circuit", which application claims the priority benefit of French patent application number 08/53069, filed on May 22, 2008, entitled "Method For Manufacturing And Testing An Integrated Electronic Circuit," which applications are hereby incorporated by reference to the maximum extent allowable by law.

BACKGROUND OF THE INVENTION

1. Field of the Invention

The present invention relates to a method for manufacturing and testing integrated circuits and, more specifically, to a method for testing integrated circuits directly on a semiconductor wafer and for preparing such integrated circuits for their encapsulation.

2. Discussion of the Related Art

Generally, integrated circuits formed on a semiconductor wafer are tested for a first time directly on the wafer. This test is carried out by means of test tips which are placed on contact pads of the integrated circuits and which enable electrically testing the circuits. Connection elements, for example, conductive bonding layers on which conductive bumps are formed, are then formed on the contact pads. After this, the integrated circuits are cut up into chips and the defective chips are eliminated. The integrated circuits are finally placed on a support and packaged. A second test is generally performed after this encapsulation step.

Integrated circuits belonging to the category of surface-mounted components (SMC) and, more specifically, of flip-chip integrated circuit chip assemblies are here considered.

During the test performed on the still uncut wafer, test tips are pressed on the contact pads formed on one surface of the integrated circuits. This pressing has the disadvantage of forming, on the contact pads, scratches which may raise problems of reliability of the connection elements formed on the contact pads. This is particularly critical when the size of integrated circuits, and thus the size assigned to the contact pads, is decreased.

To overcome this problem, it has been provided to use contact pads formed of two parts. The first part, here called the test pad, is used as a test tip pressing area and the other part, here called the connection pad, is provided for the assembly of the connection elements intended to attach the integrated circuit chip on a support. Thus, the scratches formed by the pressing of the test tips are located at the level of the test pads, these pads being no longer used hereafter. The contact between the chip and the connection elements is then ensured at the connection pad level.

However, the use of contact pads formed of two elementary pads, and thus having a relatively large surface area, is a problem when considering radio-frequency circuits, that is, circuits operating at frequencies greater than 800 MHz, or circuits having high switching frequencies.

Indeed, the test pads, which remain biased to the same voltage as the connection pads, form antennas or at least form stray capacitances and inductances with elements present in the integrated circuit next to the contact pads or in layers below said pads.

A solution for avoiding the problems of formation of parasitic components in the circuit would be to disconnect the test and the connection pads when probing is complete. Japanese patent application JP 02241046 presents this solution, the test and the connection pads being "cut" after probing. However, this cutting requires additional fabrication steps, for example a laser cut. It would be desirable to realize this disconnection without increasing the number of fabrication steps.

SUMMARY OF THE INVENTION

There thus is a need for an integrated circuit manufacturing and testing method enabling to avoid the above-mentioned problems.

For this purpose, an embodiment of the present invention provides disconnecting the test pads from the connection pads once the test on the integrated circuit wafer has been carried out.

More specifically, an embodiment of the present invention provides a specific method for disconnecting the test pads and the connection pads, this method necessitating no increase in the number of steps to be carried out with respect to known methods, this method being particularly well adapted to the case of integrated circuit chips attached to supports by conductive bumps.

Thus, an embodiment of the present invention provides a method for manufacturing and for testing an integrated circuit, comprising the steps of: forming, on the upper portion of the integrated circuit, a passivation layer comprising openings at the level of metal tracks of the last interconnect stack of the integrated circuit; forming, in the openings, first pads connected to second pads formed on the passivation layer by conductive track sections, the first pads being intended for the connection of the integrated circuit; testing the integrated circuit by bringing test tips in contact with the second pads; and eliminating at least a portion of at least one of the conductive track sections.

According to an embodiment, the eliminating of at least a portion of at least one of the conductive track sections comprises the steps of: depositing a multiple-layer conductive stack on the structure; and etching the multiple-layer stack, except above the first pads, said etching also removing the material of conductive track sections, whereby the first and second pads are disconnected.

According to an embodiment, the method further comprises, after the step of etching of the multiple-layer conductive stack, a step of forming of conductive bumps on the remaining portions of the multiple-layer stack, followed by a step of cutting-up of the integrated circuit into chips.

According to an embodiment, the first and second pads are formed of several layers, one at least of said layers of the second pads being removed at a different time than the material of the conductive track sections.

According to an embodiment, the conductive track sections and a first layer of the multiple-layer stack, in contact with the connection pads, are made of aluminum.

According to an embodiment, the multiple-layer stack is comprised of three layers.

According to an embodiment, a first layer of the multiple-layer stack, in contact with the first pads, is made of a material from the group comprising aluminum, titanium, titanium and tungsten alloys, chromium, tantalum, silver, and gold, a second layer of the multiple-layer stack is made of a material selected from the group comprising vanadium/nickel, titanium nitride, tantalum nitride, nickel, vanadium, chromium, and copper, and a third layer of the multiple-layer stack is made of a material selected from the group comprising copper, palladium, gold, and silver.

According to an embodiment, the first pads have a hexagonal shape.

According to an embodiment, the material of the passivation layer is selected from the group comprising BCB (benzocyclobutene), silicon nitride, and PI (polyimide).

An embodiment of the present invention further provides an integrated circuit comprising an upper portion in which metal tracks are formed and on which a passivation layer comprising openings above the metal tracks is formed, and comprising first pads formed on the metal tracks in the openings and second pads formed on the passivation layer, the first and second pads being connected by conductive track sections, wherein at least a portion of at least one of the conductive track sections is absent.

Another embodiment provides a system comprising at least one integrated circuit such as defined hereabove and at least another electronic element.

According to an embodiment, the system is integrated in a cell phone.

The foregoing objects, features, and advantages of the present invention will be discussed in detail in the following non-limiting description of specific embodiments in connection with the accompanying drawings.

BRIEF DESCRIPTION OF THE DRAWINGS

FIG. 1 is a cross-section view of an example of a connection between an integrated circuit chip and a support;

FIG. 2 is a top view of an example of an integrated circuit chip such as that of FIG. 1, before flipping thereof;

FIG. 3 is a top view of a contact pad in two parts;

FIG. 4 is a cross-section view illustrating the result obtained after forming connection elements on the contact pad of FIG. 3;

DETAILED DESCRIPTION

Figure 5A:
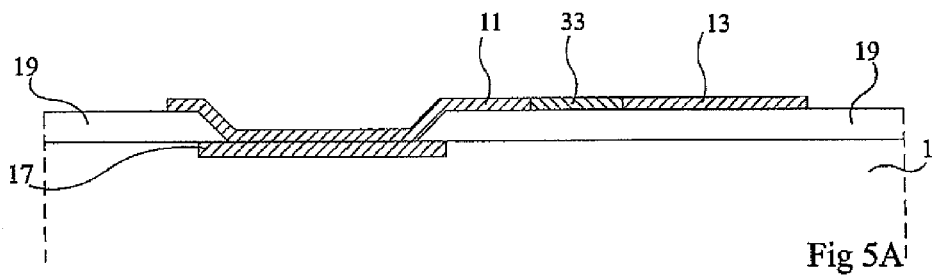
FIGS. 5A to 5G are cross-section views illustrating steps of the testing an integrated circuit according to an embodiment of the present invention, FIG. 5B being an enlargement of a portion of FIG. 5A.

For clarity, the same elements have been designated with the same reference numerals in the different drawings and, further, as usual in the representation of integrated circuits, the various drawings are not to scale.

FIG. 1 is a cross-section view of an example of a connection between an integrated circuit chip and an encapsulation support.

Many connection elements 3 are formed on contact pads of an integrated circuit chip 1 of flip-chip type, that is, balls in the shown example. Chip 1 is attached to a support 5 via connection elements 3 which are positioned on contact pads of support 5. An encapsulation layer 7 which surrounds the different connection elements 3 is formed between integrated circuit chip 1 and support 5, which enables isolating these elements from one another and which also enables to avoid for humidity to reach connection elements 3.

FIG. 2 is a top view of an example of an integrated circuit chip such as that in FIG. 1, before flipping thereof on substrate 5.

In FIG. 2, a possible arrangement of the connection elements at the chip surface has been shown. On chip 1 are formed many contact pads intended to receive connection elements 3 enabling contacting the chip on a support. In the example of FIG. 2, two lines of contact pads are formed at the chip periphery. Many arrangements of the contact pads are possible. For example, it may be provided to form contact pads across the entire surface of integrated circuit chip 1 or on a single line at the periphery of the chip surface.

FIG. 3 is a top view of an example of a contact pad formed in two parts.

The contact pad formed on integrated circuit 1 comprises two parts, a connection pad 11 on which connection elements will be formed and a test pad 13 against which a tip will be pressed during an electric test. The connection and test pads are connected via a conductive track 15. In the example shown in FIG. 3, connection pad 11 has a hexagonal shape and test pad 13 has a rectangular shape. It should be understood that he connection and test pads may have any adapted shape and that the example shown herein is disclosed as an illustration only. It should also be understood that connection pad 11 is connected in adapted fashion to metal tracks formed in lower interconnection levels.

FIG. 4 is a cross-section view illustrating the result obtained after forming of connection elements on the contact pad of FIG. 3.

A metal track 17 on which a contact is desired to be taken is formed in the upper portion of integrated circuit 1. An insulating passivation layer 19 is formed on top of the circuit and of metal track 17. Passivation layer 19 comprises an opening 21 located above metal track 17, at the level of which the connection elements will be formed. A contact pad comprising a connection pad 11, a test pad 13, and a conductive track section 15 connecting pads 11 and 13, is formed above passivation layer 19 and in opening 21. Connection pad 11 extends on track 17 in opening 21 and test pad 13 and track section 15 extend on passivation layer 19. Test and connection pads 13 and 11 and conductive track section 15 have identical structures.

A multiple-layer conductive stack 23 on which a conductive bump 31 extends is formed on the bottom and the walls of connection pad 11 in opening 21. Multiple-layer stack 23 enables good bonding and good electric contact between connection pad 11 and conductive bump 31. As an example, multiple-layer stack 23 may comprise three layers 25, 27, and 29.

An embodiment of the present invention provides a method for forming connection elements on contact pads of an integrated circuit, comprising steps enabling to disconnect the connection and test pads once the test on the wafer has been carried out. This enables avoiding interference between the test pads and elements formed in the integrated circuit, especially when the integrated circuit operates in radiofrequencies.

Figure 5B:
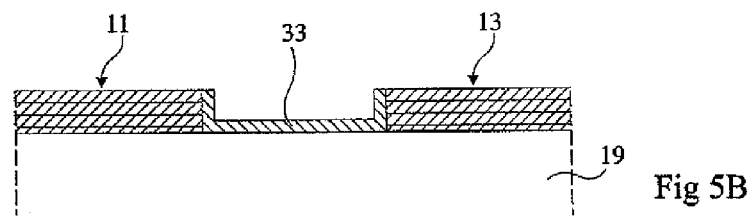

FIGS. 5A to 5G are cross-section views illustrating steps of the testing of an integrated circuit and of the manufacturing of connection elements on a connection pad of the integrated circuit according to an embodiment of the present invention, FIG. 5B being an enlargement of a portion of FIG. 5A.

In FIG. 5A, upper portion 1 of an integrated circuit wafer in which many electronic components are formed has been shown. A metal track 17 is formed in upper portion 1, in the last interconnect level of the circuit.

A passivation layer 19 extends on top of upper portion 1. As an example, passivation layer 19 may be made of silicon nitride, of BCB (benzocyclobutene) or of PI (polyimide). By means of an adapted mask, an opening 21 is formed in passivation layer 19, at the level of the contact which is desired to be taken on metal track 17.

A contact pad having the same shape, in top view, as the contact pad of FIG. 3 extends on passivation layer 19 and in opening 21. The contact pad is formed of a connection pad 11 intended to receive connection elements and formed, at the level of opening 21, of a test pad 13 on which test tips will be positioned, which extends on passivation layer 19, and of a conductive track section 33 which connects pads 11 and 13.

FIG. 5B is an enlargement of a portion of FIG. 5A at the level of conductive track section 33.

According to an embodiment of the present invention, conductive track section 33 has a structure different from that of connection and test pads 11 and 13. Connection and test pads 11 and 13 are formed of a stack of several conductive layers while the conductive track section is formed of one or of a few only of such conductive tracks.

As an example, and as shown in FIG. 5B, connection and test pads 11 and 13 may be formed of a stack of four conductive layers, and conductive track section 33 may be formed of a single one of these conductive tracks. For example, the layers forming the test and connection pads may be layers for protecting passivation layer 19 and layers enabling a good electric contact with the test tips and with the connection elements. Conductive track section 33 is formed of one or several layers present in the stack forming the connection and test pads. In the shown example, the layer forming conductive track section 33 is the last conductive layer of the stack forming the test and connection pads.

It should be noted that the example of FIG. 5B is one of the many possible variations of conductive track section 33. Conductive track section 33 may be formed of any adapted layer of the stack forming the connection and test pads.

To obtain this structure, a first mask is used to form the layers of the connection and test pads which are not in the conductive track section and a second mask is used to form the conductive track section and the remaining layers of the connection and test pads. As a non-limiting example, the conductive track section may be made of aluminum, of copper, or of titanium.

Figure 5C:
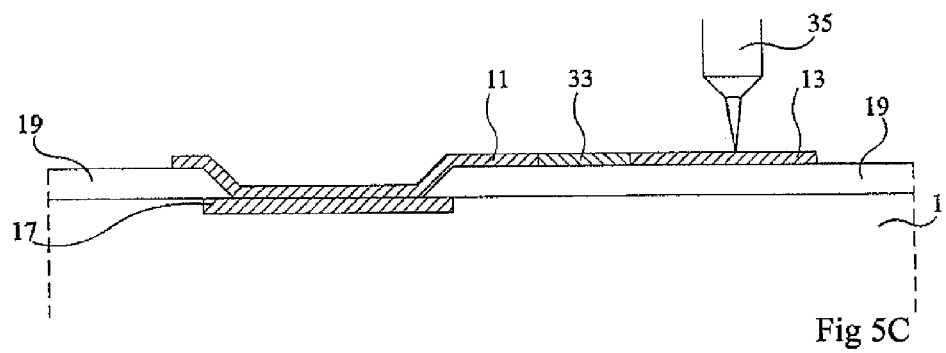

At the step illustrated in FIG. 5C, the integrated circuit formed in the wafer is tested. For this purpose, a test tip 35 is put in contact with test pad 13.

Figure 5D:
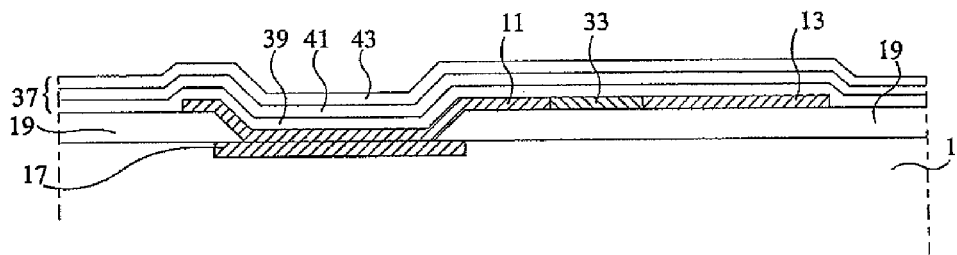

At the step illustrated in FIG. 5D, a multiple-layer conductive stack 37 (called Under Bump Metallurgy or UBM stack) has been formed on the structure of FIG. 5C. As an example, this stack may comprise three conductive tracks 39, 41, and 43. Layer 39 is called a bonding layer, layer 41 a barrier layer, and layer 43 a wettable layer. As an example, bonding layer 39 may be made of aluminum, of titanium, of a titanium and tungsten alloy, of chromium, of tantalum, of silver or again of gold. Barrier layer 41 may be made of vanadium/nickel, of titanium nitride, of tantalum nitride, of nickel, of vanadium, of chromium or of copper, and wettable layer 43 may be made of copper, of palladium, of gold, or of silver.

It should be understood that various structures of conductive stack 37 may be used. For example, conductive stack 37 may comprise less or more than three layers. Further, if the material of conductive track section 33 is aluminum, aluminum will be the material preferred for bonding layer 39.

Figure 5E:
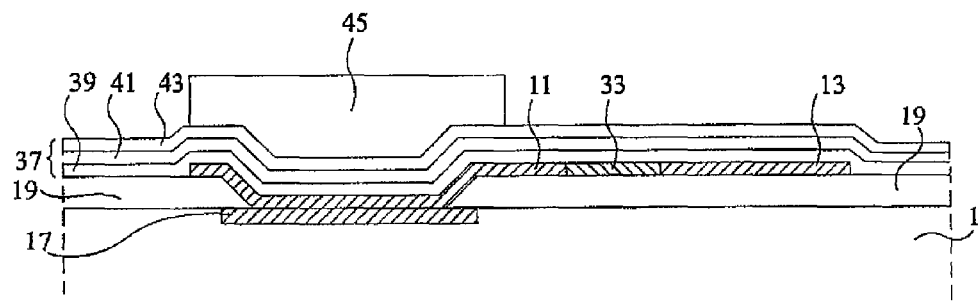

At the step illustrated in FIG. 5E, a mask 45 has been formed on conductive stack 37, above connection pad 11.

Figure 5F:
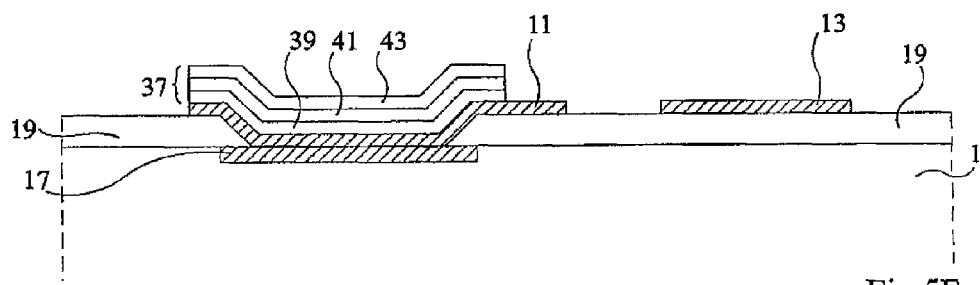

At the step illustrated in FIG. 5F, the portion of conductive stack 37 which is not protected by mask 45 has been etched once or several times. The etch operations are carried out to remove layers 39, 41, and 43 above the test pad and track section 33. These etch operations are carried on to also remove conductive track section 33. In the case where conductive track section 33 and bonding layer 39 are made of aluminum, or in the case where conductive track section 33 and one of the layers of conductive stack 37 are made of two materials which can be etched simultaneously, the same etching will enable to etch the track section and the corresponding layer of the conductive stack. In the case where conductive track section 33 and the layers of interconnection stack 37 are made of materials which cannot be etched simultaneously, an additional etching will be provided to remove the metal of conductive track section 33. In the case where conductive track section 33 is formed of the upper layer of the stack forming the test and connection pads, it should be noted that the different etch operations will also eliminate the upper portion of test pad 13. Mask 45 is then removed.

A structure in which connection pad 11 and test pad 13 are disconnected is thus obtained, conductive track section 33 being eliminated. Thus, test pad 13 is not biased to the voltage of connection pad 11. When working in radiofrequencies, this enables avoiding the creation of stray capacitances or inductances due to the biasing of test pad 13.

Figure 5G:
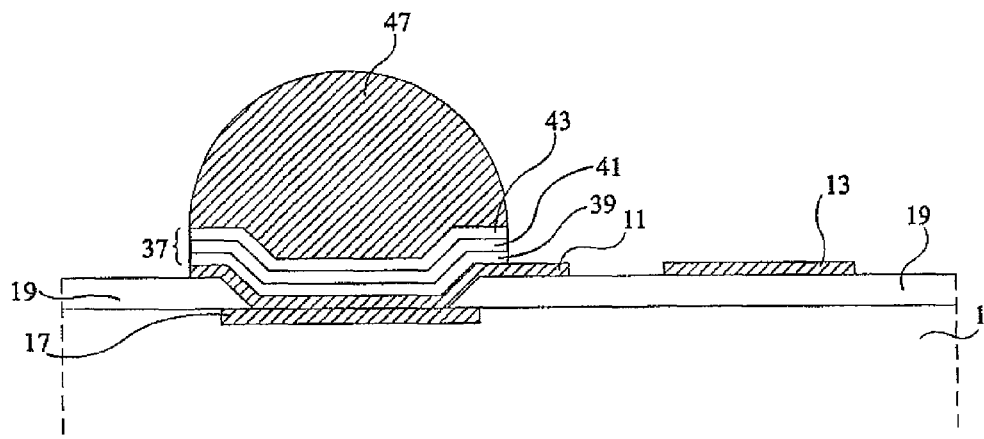

At the step illustrated in FIG. 5G, a conductive bump 47 has been formed on the remaining portion of stack 37, above connection pad 11. Conductive bump 47 is formed by any method known by those skilled in the art. As an example, conductive bump 47 may be made of a tin/copper, tin/silver, or tin/lead alloy.

Thus, the described method enables disconnecting test pad 13 from connection pad 11 once the test on the wafer has been performed. This method has the advantage of not increasing the number of steps to be carried out with respect to known methods. Indeed, it is preferably provided for conductive track section 33 to be made of one or several materials which are etched at the same time as one of the layers of conductive stack 37. Further, since conductive track section 37 is formed of one or several layers which can be found in connection and test pads 11 and 13, the forming of the track section requires no additional deposition step with respect to known methods.

It should be understood that the steps disclosed in relation with FIGS. 5A to 5G are carried out simultaneously on several contact pads of the integrated circuit wafer, or on all of them, before cutting up of the wafer into chips.

Figure 6:
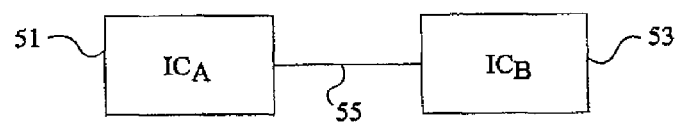
FIG. 6 illustrates a system according to an embodiment of the present invention.

FIG. 6 illustrates an embodiment of a system comprising a circuit from which at least one of the conductive track sections of the contact pads is absent.

This system comprises an integrated circuit $IC_A$ (51), the contact pads of which have been formed according to the above-described method, that is, said pads are formed of a connection pad, of a test pad, and of a conductive track section from which at least a portion has been eliminated. The system also comprises another electronic element $IC_B$ (53) which may be any known electronic element and which interacts with the integrated circuit via a connection 55. Element $IC_B$ may itself be a circuit from which at least one of the conductive track sections of the contact pads is absent. Such a system is, for example, included in a cell phone.

Specific embodiments of the present invention have been described. Various alterations and modifications will occur to those skilled in the art. It should in particular be noted that test pad 13 may have the same structure as track section 33. Thus, the metal can be totally eliminated from test pad 13 during the etching of the step of FIG. 5F.

Further, the described method may also be applied to the case of integrated circuits intended to be connected on a support by connection elements different from those disclosed herein. For example, the method described herein may be adapted to the case where the connection between the contact pads of the integrated circuit chip and the pads of the chip support is ensured by a wire (wire bonding). In this case, the following steps will be carried out:

forming, on the integrated circuits, of a passivation layer comprising openings at the level of the desired connections;

forming of contact pads formed of connection pads in the openings and of test pads on the passivation layer, the connection and test pads being connected by conductive track sections;

electrical test of the circuits by pressing test tips on the test pads;

forming of a mask at least above the connection pads;

elimination of the conductive track sections;

removal of the mask;

cutting up of the integrated circuit chips; and connection of bonding wires on the connection pads and on pads provided at the surface of the chip supports.

Such alterations, modifications, and improvements are intended to be part of this disclosure, and are intended to be within the spirit and scope of the invention. Accordingly, the foregoing description is by way of example only and is not intended as limiting. The present invention is limited only as defined in the following claims and the equivalents thereto.

What is claimed is:

1. A method for manufacturing and for testing an integrated circuit, comprising the steps of:

forming, on the upper portion of the integrated circuit, a passivation layer comprising openings at the level of metal tracks of an interconnect stack of the integrated circuit;

forming, in the openings, first pads connected to second pads formed on the passivation layer by conductive track sections, the first pads being intended for the connection of the integrated circuit;

testing the integrated circuit by bringing test tips in contact with the second pads;

depositing a multiple-layer conductive stack, for connection with conductive bumps, on the upper portion of the intergrated circuit; and etching the multiple-layer stack, except above the first pads, said track sections being of a material such that said etching also removes said track sections, whereby the first and second pads are disconnected, and wherein etching disconnects the second pads from the intergrated circuit.

2. The method of claim 1, further comprising, after the step of etching of the multiple-layer conductive stack, forming conductive bumps on remaining portions of the multiple-layer stack.

3. The method of claim 1, wherein the first and second pads comprise several layers, wherein at least one of said layers of the first pads being not removed at the same time as the conductive track sections.

4. The method of claim 1, wherein the conductive track sections and a first layer of the multiple-layer stack, in contact with the first pads, comprise aluminum.

5. The method of claim 1, wherein the multiple-layer stack comprises three layers.

6. The method of claim 1, wherein the multiple-layer stack comprises:

a first layer, in contact with the first pad, is made of a material selected from the group consisting of aluminum, titanium, titanium and tungsten alloys, chromium, tantalum, silver, and gold;

a second layer, disposed on the first layer, is made of a material selected from the group consisting of vanadium/nickel, titanium nitride, tantalum nitride, nickel, vanadium, chromium, and copper; and a third layer, disposed on the second layer, is made of a material selected from the group consisting of copper, palladium, gold, and silver.

7. The method of claim 1, wherein the first pads have a hexagonal shape.

8. The method of claim 1, wherein the material of the passivation layer is selected from the group consisting of benzocyclobutene, silicon nitride, and polyimide.

9. The method of claim 1, wherein the conductive track section is formed on the passivation layer.

10. The method of claim 2 further comprising cutting up the integrated circuit into chips.

11. A method for manufacturing an integrated circuit comprising:

forming a connection pad disposed on the integrated circuit and connected with a metal track formed in the integrated circuit;

forming a test pad disposed on the integrated circuit;

forming a conductive track section disposed on the integrated circuit and connecting the connection and test pads; and etching the integrated circuit, wherein etching the integrated circuit removes the conductive track section, wherein removing the conductive track section disconnects the test pad and the integrated circuit.

12. The method of claim 11, prior to the step of etching the integrated circuit, further comprising bringing a testing tip into contact with the test pad.

13. The method of claim 11, prior to the step of etching the integrated circuit, forming a mask at least above the connection pad.

14. The method of claim 11, wherein removing the conductive track section disconnects the connection and test pads.

15. The method of claim 11, wherein etching the integrated circuit removes the test pad.

16. The method of claim 11 further comprising forming a multi-layer conductive stack on the connection pad, test pad, and conductive track section.

17. The method of claim 16, wherein etching removes a portion of the multi-layer conductive stack.

18. The method of claim 17, wherein etching the integrated circuit comprises etching the conductive track section and at least one layer of the multi-layer conductive stack simultaneously.

19. A method for manufacturing and testing of an integrated circuit comprising:

forming a passivation layer on an upper portion of the integrated circuit with an opening located above and at a level of a metal track formed in the integrated circuit;

forming a first pad in the at least one opening, a second pad on the passivation layer, and a conductive track section connecting the first and second pads;

bringing a testing tip into contact with the second pad;

depositing a multiple-layer conductive stack on the upper portion of the integrated circuit; and etching the multiple-layer conductive stack, except above the first pad, wherein said etching also removes said conductive track section, wherein said etching disconnects the second pad and the integrated circuit.

* * * * *

UNITED STATES PATENT AND TRADEMARK OFFICE
CERTIFICATE OF CORRECTION

PATENT NO. : 8,232,113 B2
APPLICATION NO. : 12/990684
DATED : July 31, 2012
INVENTOR(S) : Romain Coffy Page 1 of 1

It is certified that error appears in the above-identified patent and that said Letters Patent is hereby corrected as shown below:

IN THE CLAIMS:

Col. 7, claim 1, lines 29-30 should read:
forming, on an upper portion of the integrated circuit, a passivation layer comprising openings at a level of Col. 7, claim 1, line 41 should read:
integrated circuit; and Col. 7, claim 1, line 46 should read:
etching disconnects the second pads from the integrated Signed and Sealed this
Eleventh Day of September, 2012

David J. Kappos
*Director of the United States Patent and Trademark Office*